US006765403B2

United States Patent
De Jong et al.

(10) Patent No.: US 6,765,403 B2
(45) Date of Patent: Jul. 20, 2004

(54) TEST CIRCUIT AND TEST METHOD FOR PROTECTING AN IC AGAINST DAMAGE FROM ACTIVATION OF TOO MANY CURRENT DRAWING CIRCUITS AT ONE TIME

(75) Inventors: Franciscus Gerardus Maria De Jong, Eindhoven (NL); Rodger Frank Schuttert, Eindhoven (NL); Johannes De Wilde, Eindhoven (NL); Gerrit Willem Den Besten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 43 days.

(21) Appl. No.: 10/067,206

(22) Filed: Feb. 5, 2002

(65) Prior Publication Data

US 2002/0149387 A1 Oct. 17, 2002

Related U.S. Application Data

(63) Continuation-in-part of application No. 09/790,419, filed on Feb. 22, 2001, now Pat. No. 6,664,798.

(30) Foreign Application Priority Data

May 23, 2001 (EP) .......................................... 01201973

(51) Int. Cl.[7] .............................................. G01R 31/02
(52) U.S. Cl. ..................................... 324/763; 324/765
(58) Field of Search ................................. 324/522–523, 324/538, 555, 763, 765, 158.1; 714/726–727, 733–734

(56) References Cited

U.S. PATENT DOCUMENTS 5,068,604 A    11/1991    Van de Lagemaat ........ 324/537
5,801,536 A *   9/1998    Brambilla et al. .......... 324/522

FOREIGN PATENT DOCUMENTS

| EP | 0647905 | 4/1995 | ........... G06F/11/24 |
|---|---|---|---|
| WO | WO0163310 | 8/2001 | ......... G01R/31/316 |

* cited by examiner

Primary Examiner—Minh N. Tang
(74) Attorney, Agent, or Firm—Michael J. Ure

(57) ABSTRACT

Power supply connections to an integrated circuit are tested. The power supply connections are connected to a power supply conductor in the integrated circuit. For the test, combinations of current drawing circuits are switched on near the point where the power supply connection under test is connected to the power supply conductor. The current drawing circuits draw a considerable current, so as to cause a detectable voltage drop over the power supply connection, if this connection is operational. Different subsets of the current drawing circuits are activated successively. To prevent that all of the current drawing circuits are switched on at the same time by error, activation of each subset is controlled by a signal indicative of completion of activation of the preceding subset. A respective signal line is provided for each subset, to provide the signal for the subset.

11 Claims, 2 Drawing Sheets

TEST CIRCUIT AND TEST METHOD FOR PROTECTING AN IC AGAINST DAMAGE FROM ACTIVATION OF TOO MANY CURRENT DRAWING CIRCUITS AT ONE TIME

This is a continuation-in-part of U.S. application Ser. No. 09/790,419 filed Feb. 22, 2001 now U.S. Pat. No. 6,664,798 (PHNL000063).

FIELD OF THE INVENTION

The invention relates to an integrated circuit and to testing of the operationality of multiple power supply connections to such an integrated circuit.

BACKGROUND OF THE INVENTION

Modern integrated circuits often have a considerable number of external power supply pins for the same power supply voltage. This plurality of power supply pins poses a problem during circuit test, because malfunctioning of a part of the power supply pins does not normally show up in tests of circuit functionality.

From U.S. Pat. No. 5,068,604 it is known to test the operationality of multiple power supply connections for the same supply voltage of an integrated circuit by observing the voltage drops along power supply conductors. For this purpose, a current drawing circuit is activated that draws a substantial current from the power supply to create an observable voltage drop.

Thus, the power supply connections can be tested both inside the integrated circuit and outside the integrated circuit, for example on a printed circuit board on which the integrated circuit is mounted.

Generally, too many current drawing circuits should not be activated all at the same time. Each current drawing circuit draws a considerable current to create an observable voltage drop. Activating all or too many current drawing circuits at the same time could damage the integrated circuit due to the large resulting currents and/or power dissipation. Supply pins should be tested only one or a few at a time, activating only a few current drawing circuits that are connected to the power supply conductor near the location where the pin or pins under test is or are connected to that power supply conductor.

The operation of the known test circuit is controlled by commands entered through a boundary scan interface. The commands control the activation of the current drawing circuits, and they should ensure that not too many current drawing circuits are activated at the same time. However, if the control interface does not operate properly, for example due to the very faults in the power supply connection, or because of errors in the commands, too many current drawing circuits might be activated simultaneously, causing damage to the integrated circuit.

SUMMARY OF THE INVENTION

Amongst others, it is an object of the invention to protect the integrated circuit against damage from activation of too many current drawing circuits at the same time.

The invention provides for an integrated circuit that comprises
a plurality of power supply pads;
a power supply conductor;
a plurality of power supply connections, each coupled between the power supply conductor and a respective one of the power supply pads at a respective location along the power supply conductor;
current test circuitry for performing detections, each of a voltage drop between a first and second point along a respective one of the power supply connections;
switchable test current drawing circuits coupled in parallel at respective further locations along the power supply conductor;
a test circuit, arranged to cause the current test circuitry to perform said detections successively, each while activating at least a respective one of the current drawing circuits, keeping inactive at least a further respective one of the current drawing circuits that is connected to the power supply conductor further from the respective one of the power supply connections on which that detection is performed than the activated respective one of the current drawing circuits.

Thus only one or more current drawing circuits close to the power supply connection under test will be activated. Current drawing circuits further from the power supply connection under test are not active when that power supply connection is tested. This prevents damage to the integrated circuit due to excessive power dissipation.

In an embodiment the test circuit comprises a functional chain of signal lines, each specific to a respective one of the detections, each for carrying a signal responsive to completion of activation of the current drawing circuit that is activated during the respective one of the detections, at least when that detection has indicated no failure, the test circuit controlling activation of the respective ones of the current drawing circuits for successive detections with signals from successive ones of the signal lines from the chain.

Thus it is ensured by a handshake mechanism that a first and second subset of current drawing circuits that are used to test different power supply connections cannot be activated simultaneously even if there are errors. This is realized by using separate signal lines for different current drawing circuits and ensuring that a set of current drawing circuits can only be activated when the signal line of the preceding set indicates that that preceding subset has been de-activated.

In an embodiment of the integrated circuit according to the invention the test circuit is triggered by a reset of the circuit, for example a power-on reset or another type of reset. Thus, the test of the power supply connections can be performed before any other test, even without loading a scan chain. Power supply faults, which might lead to erroneous results in other tests can thus be detected before these other tests are performed.

In another embodiment of the integrated circuit according to the invention, activation of a subset of the current drawing circuits is triggered by an indication that a test using a previous subset of current drawing circuits has detected no failure. Thus, no additional signal lines are needed to sequence the activation of different subsets of the current drawing circuits. If one of the tests indicates a failure, no further tests are performed, additionally reducing the risk of damage.

BRIEF DESCRIPTION OF THE DRAWING

These and other objects and advantages of the circuits and methods according to the invention will be described in more detail using the following drawing.

DETAILED DESCRIPTION OF THE INVENTION

Figure 1:
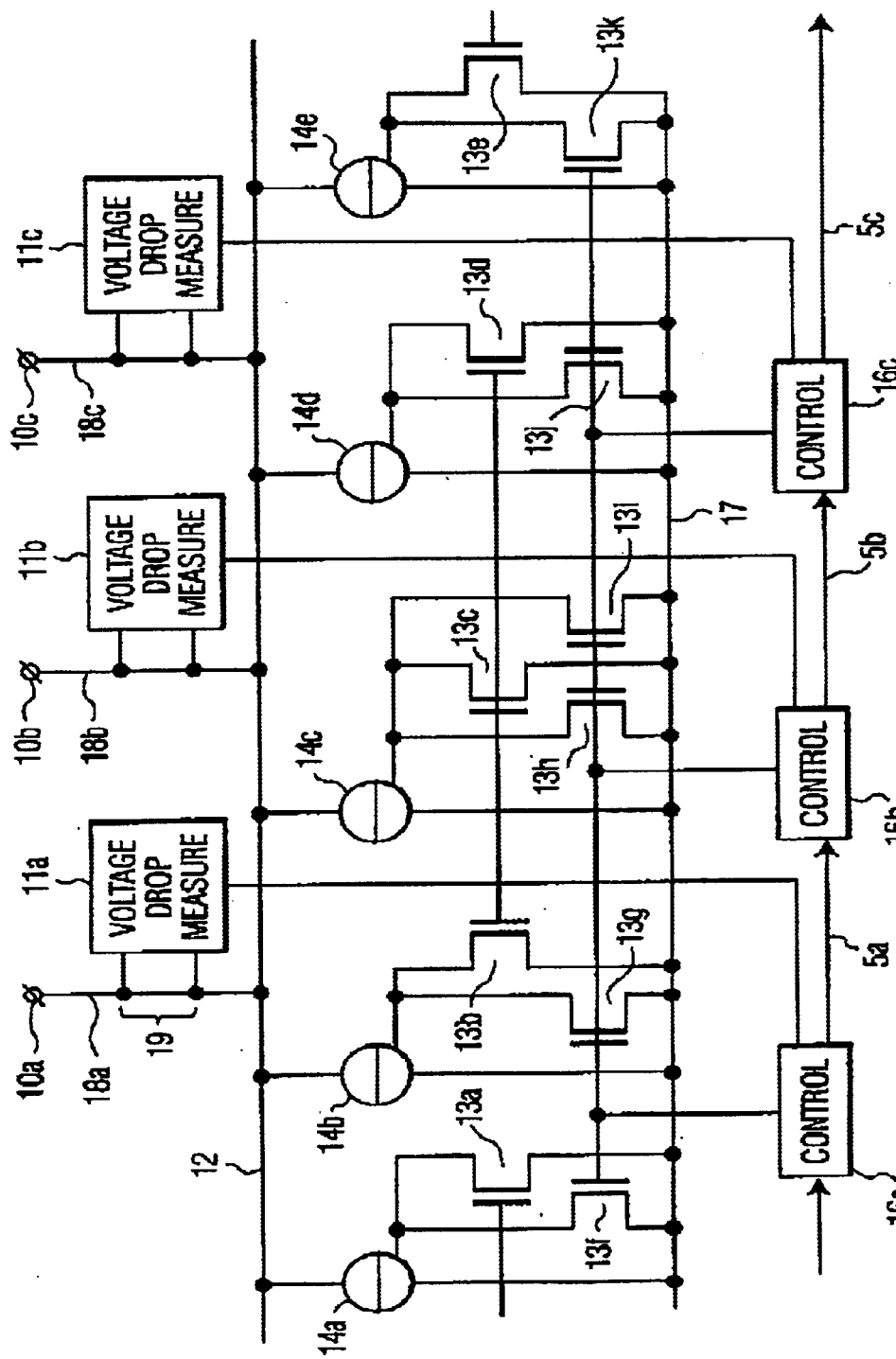
FIG. 1 shows a circuit

FIG. 1 shows part of an integrated circuit. The integrated circuit contains power supply pins 10a–c of the integrated circuit and a power supply conductor 12 connected via respective power supply connections 18a–c. The integrated circuit also contains voltage drop measuring circuits 11a–c, control switches 13a–k, current sources 14a–e, control circuits 16a–c and a further power supply conductor 17. The power supply conductor 12 is coupled to the further power supply conductor 17 via a number of current sources 14a–e. The control switches 13a–k are controlled by control circuits 16a–c. The voltage drop measuring circuits 11a–c are each coupled at two points to a respective one of the power supply connections 18a–c. The control circuits 16a–c are coupled in a chain, each control circuit in the chain having an output coupled to a next control circuit 16a–c in the chain.

The power supply conductor 12 normally serves to distribute supply power supply current to normal operating circuits (not shown) such as memories, processor cores etc. in the integrated circuit. When the integrated circuit is mounted on a carrier, such as a printed circuit board (not shown), the supply pins 10a–care electrically connected to one or more supply lines (not shown) on the printed circuit boards. Current is supplied to the power supply conductor 12 from the printed circuit board via the supply pins 10a–c.

The components shown in FIG. 1 serve to test whether current is supplied normally from each of the power supply pins 10a–c.

In operation, current from each power supply pin 10a–c is detected successively. To test the current from a supply pin 10a–c, a control circuit 16a–c activates (make conductive) a subset of the current sources 14a–e, so that only this subset of the current sources 14a–e draws current from the power supply conductor 12.

The first control circuit 16a for example makes a first, second and third current source 14a–c draw current from the power supply conductor 12. The second current source 14b draws current mainly from the first power supply connection 18a. The first and third current source prevent that this current is significantly reduced due to currents from other power supply connections. When first control circuit 16a has activated the first, second an third current source 14a–c, first control circuit 16a reads a current detection result from the first voltage drop measuring circuit 11a.

The first voltage drop measuring circuit 11a compares the voltage drop over a part 19 of the power supply connection 18a with a threshold and outputs a result of this comparison to first control circuit 16a. This voltage drop is a consequence of the (small) parasitic resistance of the part 19 and the supply current through the connection 18a (if any). Once the result of the comparison has been obtained, first control circuit 16a deactivates the first, second an third current source 14a–c.

The first control circuit 16a signals on its output to second control circuit 16b via signals line 5a that the current sources 14a–c have been deactivated. In response, the second control circuit starts its part of the test, activating the second, third and fourth current source 14b–d and measuring the current through the second power supply connection 18b. At the end of this measurement the second control circuit 16b deactivates the current sources 14b–d and signals completion to the next control circuit 16c via its signal line 5b and so on the other, each activating a subset of the current sources 14a–e. At no time all of the current sources 14a–e are active simultaneously.

In one embodiment, the control circuits operate under control of a clock (not shown), taking over control signals to start testing from preceding circuits on clock edges. In another embodiment, the control circuits are asynchronous, starting testing upon a transition in a signal from a preceding control circuit.

Although FIG. 1 shows a particular embodiment it will be clear that different embodiments are possible without deviating from the invention. For example, in general a much larger number of power supply connections 18a–c and current sources 14a–e will be connected to the power supply conductor 12. Also, the number of current sources that is activated may vary. For example, in some cases a control circuit may activate only a single current source and in other cases the control circuit may activate more than three current source. This depends on the extent to which it is necessary to screen the effect of different power supply connections, which in turn depends on the required accuracy and the topography of the integrated circuit. Instead of current sources 14a–e other current drawing elements may be used etc.

FIG. 1 shows the control circuits 16a–c activating each other in a single chain. However, without deviating from the invention the control circuits may activate each other in more complicated sequences.

Figure 2:
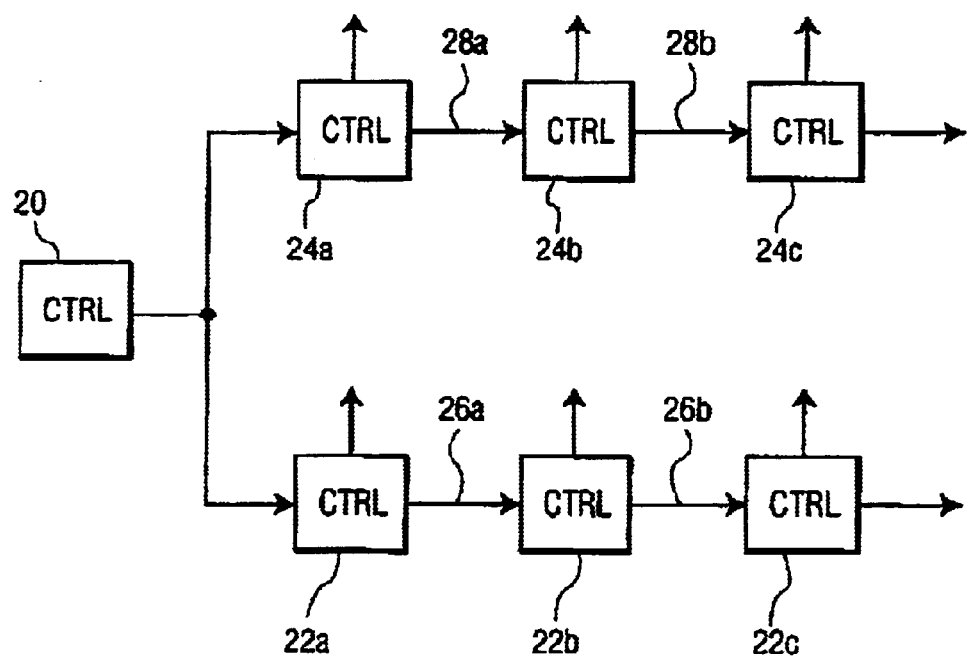
FIG. 2 shows a further circuit.

FIG. 2 shows connections between control circuits 20, 22a–c and 24a–c. In this arrangement, the control circuits in a first chain 22a–c activate each other in turn and control circuit in a second branch 24a–c activate each other in turn via signal lines 26a–b, 28a,b respectively. Such a structure may be used for example when the current drawing circuits controlled by the control circuits 22a–c in the first chain are at a substantial distance in the integrated circuit from the current drawing circuits controlled by the control circuits 24a–c in the second chain. Thus, the test is speeded up.

Various types of signal lines 5a–c, 26a–b, 28a–b may be used to pass control signals from one control circuit 16a–c, 20, 22a–c, 24a–c to another. In one embodiment, a "ready" signal output is used for this, which is asserted when the test has been completed. In this embodiment the tests are preferably executed for all power supply connections and the results of these tests are read out through a shift register, or "anded" to form a single fail/no fail result indicating whether any or none of the power supply connection has failed.

In an advantageous embodiment a test result output of the control circuit is used for this. In this embodiment, all control circuits are reset to a "fail" state at the start of testing. When a voltage drop measuring circuit 11a–c measures that current flows through a connection under test, the control circuit is set to the no-fail state. A signal indicating the sate of the control circuit is passed to the next control circuit to control the start of the test. Thus, a control circuit will not start a test if any of its predecessors has detected a failure. At the end of the chain (or chains) of control circuits only the output of the final control circuit needs to be read out to determine whether the integrated circuit has no power supply failures.

The start of the test may be controlled by a command from a scan chain (not shown). But in a preferred embodiment, the test is started by a signal at a reset input (not shown) of the integrated circuit, or by a circuit which detect power up and signals this to a reset input. Such a reset input is also coupled to various functional elements (not shown) in the integrated circuit and has a function in normal (non-test) operation of the integration circuit to set these functional element to a suitable initial state for starting normal operation. By using the reset input to triggered the power supply test (preferably conditional on a test enable signal to the integrated circuit being asserted during the reset) it is ensured that the power supply test is executed at the start of operation of the integrated circuit, starting before any other tests.

This has the advantage of eliminating the influence of any errors on the start of the test and of making it possible to stop further testing at the start of testing if there is a power supply failure, which might compromise further tests. It will be clear that this advantage also holds when no special measures (such as signal lines 5a–c) are provided to prevent simultaneous activation of the current drawing circuits 14a–e. But the use of such signal lines is especially advantageous in the case of power supply test on reset, because in that case the tests circuit cannot be independently tested before switching on the current drawing circuits to detect the risk of damage due to errors.

What is claimed is:

1. An integrated circuit that comprises
   a plurality of power supply pads;
   a power supply conductor;
   a plurality of power supply connections, each of the plurality of power supply connections coupled between the power supply conductor and a respective one of the power supply pads at a respective location along the power supply conductor;
   voltage drop measuring circuitry for performing detections of a voltage drop between a first and second point along a respective one of the power supply connections;
   switchable test current drawing circuits coupled in parallel at respective further locations along the power supply conductor;
   a test circuit, arranged to cause the voltage drop measuring circuitry to perform said detections successively while activating at least a respective one of the current drawing circuits.

2. The integrated circuit according to claim 1, wherein the test circuit is arranged to activate during each detection a respective pair of the current drawing circuits in addition to said respective one of the current drawing circuits, so that the current drawing circuits of the respective pair are connected to a power supply connection between the respective one of current drawing circuits and any power supply connections other than power supply connection on which that detection is performed.

3. The integrated circuit according to claim 1, wherein during a detection the respective current drawing circuit that is activated during that detection is connected along the power supply conductor nearer to the power supply connections on which that detection is performed than to any other one of the power supply connections.

4. The integrated circuit according to claim 1, the test circuit comprising a functional chain of signal lines, each signal line specific to a respective one of the detections for carrying a signal responsive to completion of activation of the at least one current drawing circuit that is activated during the respective one of the detections, at least when that detection has indicated no failure, the test circuit controlling activation of the at least one of the current drawing circuits for successive detections with signals from successive ones of the signal lines from the chain.

5. The integrated circuit according to claim 1, comprising an overall reset input for resetting functional circuits of the integrated circuit, the test circuit being arranged to start alternately activating the different signal lines from a start of a chain in response to a reset signal.

6. The integrated circuit according to claim 1, wherein a signal on a signal line is a signal indicative of failure or no-failure result of the test of the corresponding power supply connection under detection, the test circuit being arranged to indicate a failure on said signal line at least until the test during activation of the corresponding power supply connection is executed, the at least one current drawing circuit being activated only if a no-failure result is indicated for the test involving activation of a preceding at least one current drawing circuits.

7. A method of testing an integrated circuit, wherein the integrated circuit has a plurality of power supply pads, a power supply conductor and a plurality of power supply connections, each of the plurality of power supply connections coupled between the power supply conductor and a respective one of the power supply pads at a respective location along the power supply conductor, the method comprising
   performing a plurality of detections of a voltage drop between a first and second point along a respective one of the power supply connections;
   switching on at least one test current drawing circuits during each detection, wherein the at least one test current drawing circuit that is switched on during a first one of the detections is switched off during a second one of the detections, when the at least one current drawing circuit that is switched on during the first one of the detections is connected to along the power supply conductor further from the power supply connections on which the second one of the detection is performed than the at least one of the current drawing circuits that is switched on during the further one of the detections.

8. The method according to claim 7, comprising activating during each detection a respective pair of the current drawing circuits in addition to said respective one of the current drawing circuits, so that the current drawing circuits of the respective pair are connected to a power supply connection between the respective one of current drawing circuits and any power supply connections other than power supply connection on which that detection is performed.

9. The method according to claim 8, wherein during each detection the respective current drawing circuit that is activated during that detection is connected along the power supply conductor nearer to the power supply connections on which that detection is performed than to any other one of the power supply connections.

10. The method according to claim 7, test circuit comprising a functional chain of signal lines, each signal line specific to a respective one of the detections carrying a signal responsive to completion of activation of the current drawing circuit that is activated during the respective one of the detections, at least when that detection has indicated no failure, the method comprising activation of the respective ones of the current drawing circuits for successive detections with signals from successive ones of the signal lines from the chain.

11. The-method according to claim 7, wherein a signal on a signal line is a signal indicative of failure or no-failure result of a test during activation of the corresponding power supply connection under detection, a test circuit being arranged to indicate a failure on said signal line at least until the test during activation of the corresponding power supply connection is executed, the current drawing circuits being activated only if a no-failure result is indicated after detection during activation of preceding current drawing circuits.

* * * * *